US010298033B2

(12) United States Patent
Zhang

(10) Patent No.: US 10,298,033 B2
(45) Date of Patent: May 21, 2019

(54) INFORMATION PROCESSING METHOD, SMART BATTERY, TERMINAL AND COMPUTER STORAGE MEDIUM

(71) Applicant: ZTE Corporation, Shenzhen, Guangdong (CN)

(72) Inventor: Jian Zhang, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 143 days.

(21) Appl. No.: 15/505,138

(22) PCT Filed: Oct. 24, 2014

(86) PCT No.: PCT/CN2014/089476
§ 371 (c)(1),
(2) Date: Feb. 20, 2017

(87) PCT Pub. No.: WO2015/117409
PCT Pub. Date: Aug. 13, 2015

(65) Prior Publication Data
US 2017/0271896 A1      Sep. 21, 2017

(30) Foreign Application Priority Data

Aug. 21, 2014   (CN) .......................... 2014 1 0416362

(51) Int. Cl.
*H02J 7/00*         (2006.01)
*G01R 31/36*        (2019.01)
(Continued)

(52) U.S. Cl.
CPC ........ *H02J 7/0029* (2013.01); *G01R 31/3648* (2013.01); *H01M 10/4257* (2013.01);
(Continued)

(58) Field of Classification Search
CPC .................. H02J 7/0029; H02J 7/0047; H02J 2007/0096; H02J 2007/0098;
(Continued)

(56) References Cited

U.S. PATENT DOCUMENTS 9,148,009 B2    9/2015  Xiang
2002/0030494 A1  3/2002  Araki
(Continued)

FOREIGN PATENT DOCUMENTS

CN      101106283 A    1/2008
CN      102074984 A    5/2011
(Continued)

OTHER PUBLICATIONS

Supplementary European Search Report in European application No. 14881851.1, dated Aug. 2, 2017, 9 pgs.
(Continued)

*Primary Examiner* — Drew A Dunn
*Assistant Examiner* — Sailesh Thapa
(74) *Attorney, Agent, or Firm* — Cooper Legal Group, LLC

(57) ABSTRACT

The disclosure discloses an information processing method, a smart battery, a terminal and a computer storage medium. The method includes: detecting battery capacity information; detecting battery electric quantity information in real time in the process of charging a battery according to the battery capacity information; and sending the battery electric quantity information and the battery capacity information to the terminal.

10 Claims, 4 Drawing Sheets

(51) Int. Cl.
*H01M 10/42* (2006.01)
*H01M 10/44* (2006.01)
*H01M 10/48* (2006.01)
*G01R 31/382* (2019.01)

(52) U.S. Cl.
CPC ......... *H01M 10/44* (2013.01); *H01M 10/443* (2013.01); *H01M 10/48* (2013.01); *H01M 10/486* (2013.01); *H02J 7/0047* (2013.01); *G01R 31/382* (2019.01); *H01M 2010/4271* (2013.01); *H01M 2010/4278* (2013.01); *H02J 2007/0096* (2013.01); *H02J 2007/0098* (2013.01)

(58) Field of Classification Search
CPC ........... G01R 31/3648; G01R 31/3606; H01M 10/486; H01M 10/443; H01M 10/4257; H01M 10/44; H01M 10/48; H01M 2010/4271; H01M 2010/4278
See application file for complete search history.

(56) References Cited

U.S. PATENT DOCUMENTS

| | | |
|---|---|---|
| 2005/0237024 A1 | 10/2005 | Hogari |
| 2010/0052619 A1* | 3/2010 | Bishop .................. H02J 7/0031 320/136 |
| 2010/0121511 A1* | 5/2010 | Onnerud ............. B60L 11/1851 701/22 |
| 2015/0043117 A1 | 2/2015 | Xiang |

FOREIGN PATENT DOCUMENTS

| | | | |
|---|---|---|---|
| CN | 102239064 | A | 11/2011 |
| CN | 102590756 | A | 7/2012 |
| CN | 103035968 | A | 4/2013 |
| CN | 103227350 | A | 7/2013 |
| CN | 203368107 | U | 12/2013 |
| CN | 203504154 | U | 3/2014 |
| JP | 2006177764 | * | 7/2006 |
| JP | 2006177764 | A | 7/2006 |
| JP | 2012505628 | A | 3/2012 |

OTHER PUBLICATIONS

International Search Report in international application No. PCT/CN2014/089476, dated May 25, 2015, 2 pgs.

English Translation of the Written Opinion of the International Search Authority in international application No. PCT/CN2014/089476, dated May 25, 2015, 6 pgs.

* cited by examiner

INFORMATION PROCESSING METHOD, SMART BATTERY, TERMINAL AND COMPUTER STORAGE MEDIUM

TECHNICAL FIELD

The disclosure relates to the field of battery technology, and in particular to an information processing method, a smart battery, a terminal and a computer storage medium.

BACKGROUND

With the increasing popularity of mobile terminals in the daily life, people give more concern on the performance of batteries that provide energy for mobile terminals. Therefore, it is an important subject to effectively control the battery so that the safety of the battery is ensured and the performance of the battery can be maximized.

The conventional art uses the current input and output of the detected battery to calculate the battery electric quantity in general for controlling the battery, and detects the voltage and temperature as auxiliary conditions. The detected battery electric quantity is divided by the known battery capacity to acquire the actual percentage of the battery capacity. In addition, the charge and overcharge protection of the battery is also controlled by the terminal.

However, in the conventional art, there are some disadvantages: at present, the terminal can only detect the battery of the specified capacity. The battery capacity will gradually decay with the use of the battery for a long time, and the terminal cannot automatically calibrate the battery capacity information. In addition, there is a large error when determining the battery electric quantity by voltage when the terminal is started up. The error will be relatively larger because there is much virtual battery current especially in the low-voltage charge. Further, there will be abnormal phenomenon in the terminal such as a dead halt when it is overcharged and the temperature is too high, so that the terminal cannot turn off the function of charging and thus the battery is overcharged easily, or even an explosion and other accidents will occur.

SUMMARY

In order to solve the existing technical problems, embodiments of the disclosure provides an information processing method, a smart battery, a terminal and a computer storage medium.

In a first aspect, an embodiment of the disclosure provides an information processing method, including:
detecting battery capacity information;
detecting battery electric quantity information in real time in the process of charging a battery according to the battery capacity information; and
sending the battery electric quantity information and the battery capacity information to the terminal.

In the above solution, detecting the battery capacity information includes:
acquiring the battery capacity information at the completion of charging for the battery in which the electric energy stored at the start of charging is below a preset threshold.

In the above solution, the method further includes:
detecting temperature information of the battery in the process of charging the battery, and determining whether to charge an energy storage unit of the battery according to the battery electric quantity information, the battery capacity information, and the temperature information.

In the above solution, the method further includes:
controlling a battery charging protection unit of the battery to stop charging the energy storage unit when the battery electric quantity information, the battery capacity information and the temperature information are detected to reach a preset condition; and
controlling the battery charging protection unit to charge the energy storage unit when the battery electric quantity information, the battery capacity information and the temperature information are detected to not reach the preset condition.

In the above solution, the method further includes sampling a voltage corresponding to the electric energy in the battery to generate a sampled voltage that is configured to provide a basis for detecting the battery electric quantity information.

In a second aspect, an embodiment of the disclosure provides a smart battery, including: an energy storage unit and a battery control unit; wherein
the energy storage unit is configured to store electric energy and provide electric energy to a terminal and the battery control unit; and
the battery control unit is configured to detect battery capacity information, detect battery electric quantity information in real time in the process of charging a battery according to the battery capacity information; and send the battery electric quantity information and the battery capacity information to the terminal.

In the above solution, the battery control unit is further configured to acquire the battery capacity information at the completion of charging for the smart battery in which the electric energy stored at the start of charging is below a preset threshold.

In the above solution, the smart battery further includes a battery charging protection unit;
the battery control unit is further configured to control the battery charging protection unit to stop charging the energy storage unit when the battery electric quantity information, the battery capacity information and the temperature information are detected to reach a preset condition; and
control the battery charging protection unit to charge the energy storage unit when the battery electric quantity information, the battery capacity information and the temperature information are detected to not reach the preset condition.

In the above solution, the battery charging protection unit includes: a P-channel Metal Oxide Semiconductor (PMOS) transistor, a transistor, a first resistor, a second resistor, and a third resistor;
the drain of the PMOS transistor is electrically connected with the terminal after being electrically connected with the input of the first resistor, the source of the PMOS transistor is electrically connected with the energy storage unit, the output of the first resistor is electrically connected with the collector of the transistor after being electrically connected with the gate of the PMOS transistor, the input of the second resistor is electrically connected with the battery control unit, the output of the second resistor is respectively electrically connected with the input of the third resistor and the base of the transistor, and the output of the third resistor is grounded after being electrically connected with the emitter of the transistor; and
the transistor and the PMOS transistor are respectively conductive, and charge the energy storage unit when the input of the second resistor receives a high level outputted by the battery control unit; and the transistor and the PMOS transistor are non-conductive and stop charging the energy storage unit when the input of the second resistor receives a low level outputted by the battery control unit.

In the above solution, the smart battery further includes: a voltage sampling unit configured to sample a voltage of the electric energy to generate a sampled voltage and to send the sampled voltage to the battery control unit; wherein the sampled voltage is configured to provide a basis for detecting the battery electric quantity information.

In a third aspect, an embodiment of the disclosure provides a terminal including the above smart battery, the terminal further including:

a processor configured to receive the battery electric quantity information and the battery capacity information sent by the smart battery, and process the battery electric quantity information and the battery capacity information as displayable information; and a display configured to display the displayable information.

In a fourth aspect, an embodiment of the disclosure provides a computer storage medium including a set of instructions which, when executed, cause at least one processor to execute the above information processing method.

By using the above technical solutions, the embodiments of the disclosure have at least the following advantages.

The information processing method, the smart battery, the terminal, and the computer storage medium provided in the embodiments of the disclosure overcome individual differences among different batteries. The electric quantity detection and the battery protection are provided to the battery to control by itself. The battery capacity can be calibrated in real time and the battery electric quantity can be updated in time through its own integrated control for the battery, and the detection result is sent to the terminal. After an abnormal situation occurs in the battery, if the terminal does not stop charging in time, the battery charging can be cut off in time.

BRIEF DESCRIPTION OF THE DRAWINGS

In the drawings which are not necessarily drawn to scale, a same reference numeral may be used to describe a same component in different views. Similar reference numerals with different letter suffixes may represent different examples of similar components. The drawings illustrate, by way of example, and not limitation, the various embodiments discussed herein in general.

DETAILED DESCRIPTION

The disclosure will be described in detail below with reference to the accompanying drawings and the preferred embodiments for the purpose of further illustrating the technical means and the effect of the disclosure for achieving the intended purpose.

Figure 1:
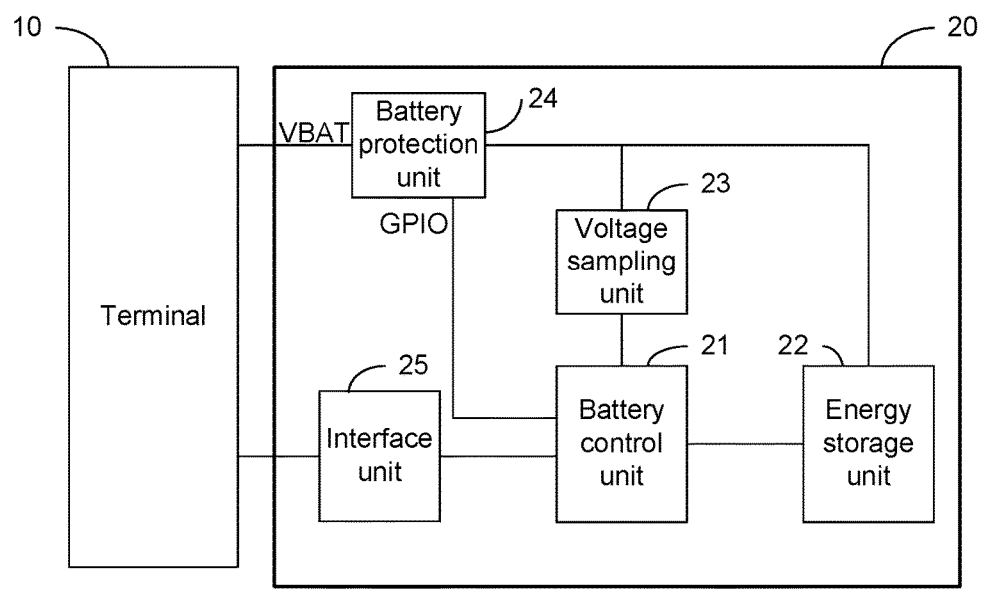
FIG. 1 is a schematic view of forming a smart battery according to a first embodiment of the disclosure.

The first embodiment of the disclosure provides a smart battery. As shown in FIG. 1, the smart battery 20 is used together with the terminal 10. The smart battery 20 includes: a battery control unit 21, an energy storage unit 22, a voltage sampling unit 23, a battery charging protection unit 24, and an interface unit 25.

The battery control unit 21 is configured to detect the electric energy information in the energy storage unit 22 in the process of charging and to send the battery electric quantity information and the battery capacity information to the terminal 10.

Specifically, the battery control unit 21 is configured to detect the battery electric quantity information in real time during the process of charging, and to acquire the battery capacity information at the completion of charging for the smart battery in which the electric energy stored at the start of charging is below a preset threshold.

Herein, the electric energy information includes charging or discharging state information of the energy storing unit 22, battery electric quantity information, and battery capacity information. The battery control unit 21 is further configured to detect the temperature information of the smart battery 20 and generate command information according to the electric energy information and the temperature information.

When it is detected that the electric energy information and the temperature information reach the preset condition, the charging of the energy storage unit 22 is prohibited. It is preferable that the preset condition is that the temperature of the battery exceeds the preset value, for example, 50° C.; or when the electric quantity of the battery reaches 100%. The preset conditions may also be set according to actual needs.

The energy storage unit 22 is allowed to be charged when it is detected that the electric energy information and the temperature information do not reach the preset conditions.

The energy storage unit 22 is configured to store electric energy and provide electric energy to the terminal and the battery control unit 21.

Specifically, the energy storage unit 22 in the embodiment of the disclosure is equivalent to the battery that does not have other control units. The energy storage unit 22 is capable of supplying electric power to the terminal 10 and the battery control unit 21, and allows to be charged under a specific condition. That is to say, the battery control unit 21 makes a decision as to whether the energy storage unit 22 is allowed to be charged according to the electric energy information and the temperature information.

In one embodiment, the battery control unit 21 includes a Central Processing Unit (CPU), a memory, and a peripheral circuit thereof, and has calculation and storage functions. According to the actual needs, the corresponding functions can be added.

The voltage sampling unit 23 is configured to sample a voltage of the electric energy supplied from the energy storage unit 22 to generate a sampled voltage and to send the sampled voltage to the battery control unit 21. Moreover, the voltage sampling unit 23 is further configured to convert the electric energy into the voltage required by the battery control unit 21 and to supply the required voltage to the battery control unit 21.

In addition, it is also possible to provide a voltage conversion unit configured to replace the voltage conversion function of the voltage sampling unit 23 so that the voltage sampling unit 23 has only the function of voltage sampling and may be specifically provided according to actual needs.

If the voltage conversion unit is provided, the energy storage unit 22 is configured to supply the electric energy to the battery control unit after performing voltage transformation processing on the electric energy through the voltage conversion unit. The voltage conversion unit is configured to perform voltage transformation processing on the electric energy. The voltage transformation processing includes converting the electric energy into the voltage required by the battery control unit 21.

The battery charging protection unit 24 is configured to send command information according to the battery control unit 21 to prohibit or allow the energy storage unit 22 to be charged.

Figure 2:
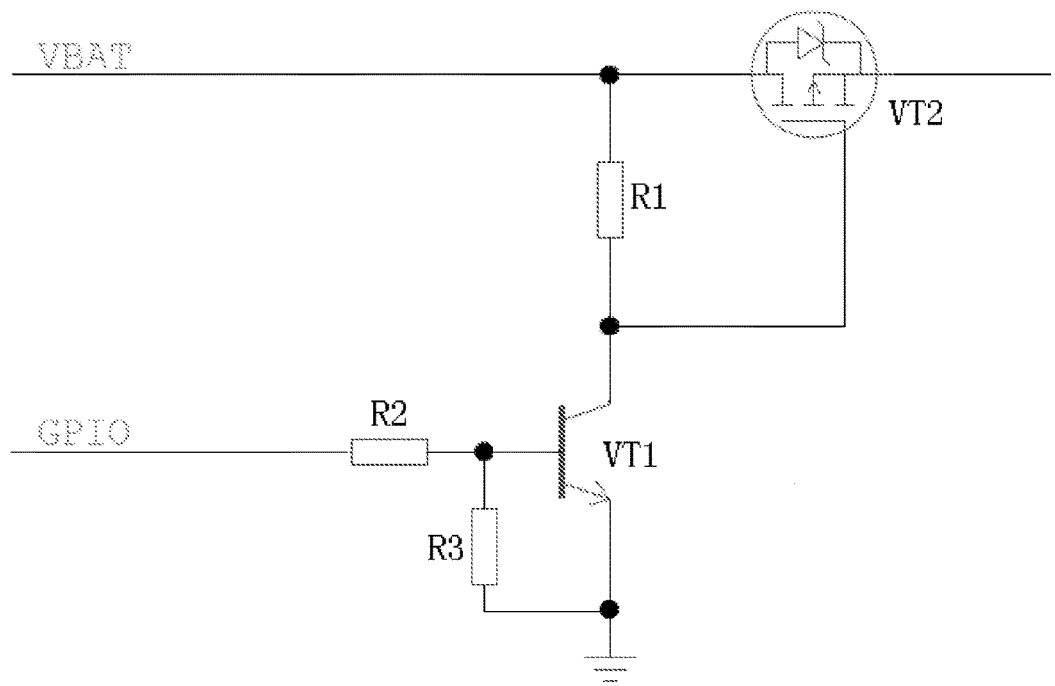
FIG. 2 is a schematic diagram of a battery charging protection unit in FIG. 1.

Specifically, as shown in FIG. 2, the battery charging protection unit 24 includes: a P-channel Metal Oxide Semiconductor (PMOS) transistor VT2, a transistor VT1, a first resistor R1, a second resistor R2, and a third resistor R3; wherein the drain of the PMOS transistor VT2 is electrically connected with the terminal after being electrically connected with the input of the first resistor R1. The source of the PMOS transistor VT2 is electrically connected with the energy storage unit. The output of the first resistor R1 is electrically connected with the collector of the transistor VT1 after being electrically connected with the gate of the PMOS transistor VT2. The input of the second resistor R2 is electrically connected with the battery control unit. The output of the second resistor R2 is respectively electrically connected with the input of the third resistor R3 and the base of the transistor VT1. The output of the third resistor R3 is grounded after being electrically connected with the emitter of the transistor VT1.

The input of the second resistor R2 receives command information. The transistor VT1 and the PMOS transistor VT2 are conductive respectively when the command information indicates a high level, and the battery charging protection unit 24 allows the energy storage unit 22 to be charged. The transistor VT1 and the PMOS transistor VT2 are non-conductive when the command information indicates a low level, and the battery charging protection unit 24 does not allow the energy storage unit 22 to be charged.

In addition, the smart battery provided in the first embodiment of the disclosure further includes:

an interface unit 25 configured to provide an interface for communication between the smart battery 20 and the terminal 10.

Specifically, the battery control unit 21 sends the electric energy information to the terminal 10 through the interface unit 25. The interface unit 25 is preferably an I2C interface.

Figure 3:
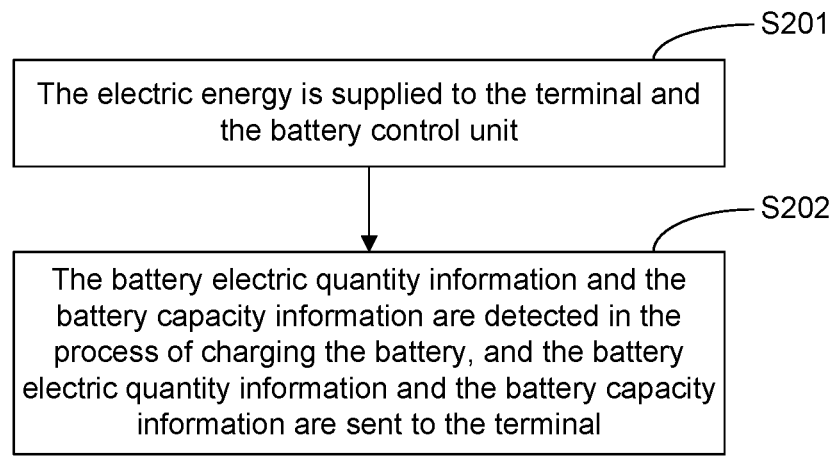
FIG. 3 is a flow chart of an information processing method according to a second embodiment of the disclosure.

The second embodiment of the disclosure provides an information processing method. As shown in FIG. 3, the method includes the following steps.

Step S201: The electric energy is supplied to the terminal and the battery control unit of the smart battery.

Specifically, in the second embodiment of the disclosure, when the smart battery is charged, the charged electric energy is stored in the energy storage unit of the smart battery, and the energy storage unit also provides the required electric energy for the terminal and other units in the smart battery.

Step S202: The battery electric quantity information and the battery capacity information are detected in the process of charging the battery, and the battery electric quantity information and the battery capacity information are sent to the terminal.

Specifically, in the process of charging, the temperature information of the smart battery is detected, and it is determined whether the energy storage unit of the smart battery is charged according to the battery electric quantity information, the battery capacity information, and the temperature information of the smart battery.

The electric energy information includes charging or discharging state information of the energy storing unit, the current battery electric quantity information and the total capacity information of the battery.

Firstly, a corresponding value table of the open circuit voltage of the battery, the battery electric quantity and the battery internal resistance needs to be created in respective preset temperature of the smart battery. In the second embodiment of the disclosure, the corresponding value table of the open circuit voltage of the smart battery, the battery electric quantity and the battery internal resistance may be created at the temperature of −10° C., 0° C., 25° C. and 50° C., and the corresponding values of the open circuit voltage, the battery electric quantity and the battery internal resistance are written in the table for the above temperatures. When the temperature of the smart battery is detected as one of the above temperatures, as long as one of the values of the open circuit voltage, the battery electric quantity and the battery internal resistance is known, the other two values may be acquired by inquiring the corresponding value table. Moreover, when the smart battery leaves factory, the battery capacity and the pre-charging electric quantity of the battery are written into the battery control unit. It should be noted that in the embodiments of the disclosure, all the batteries involved refer to smart batteries, and may also refer to other batteries when meeting a certain conditions.

Figure 4:
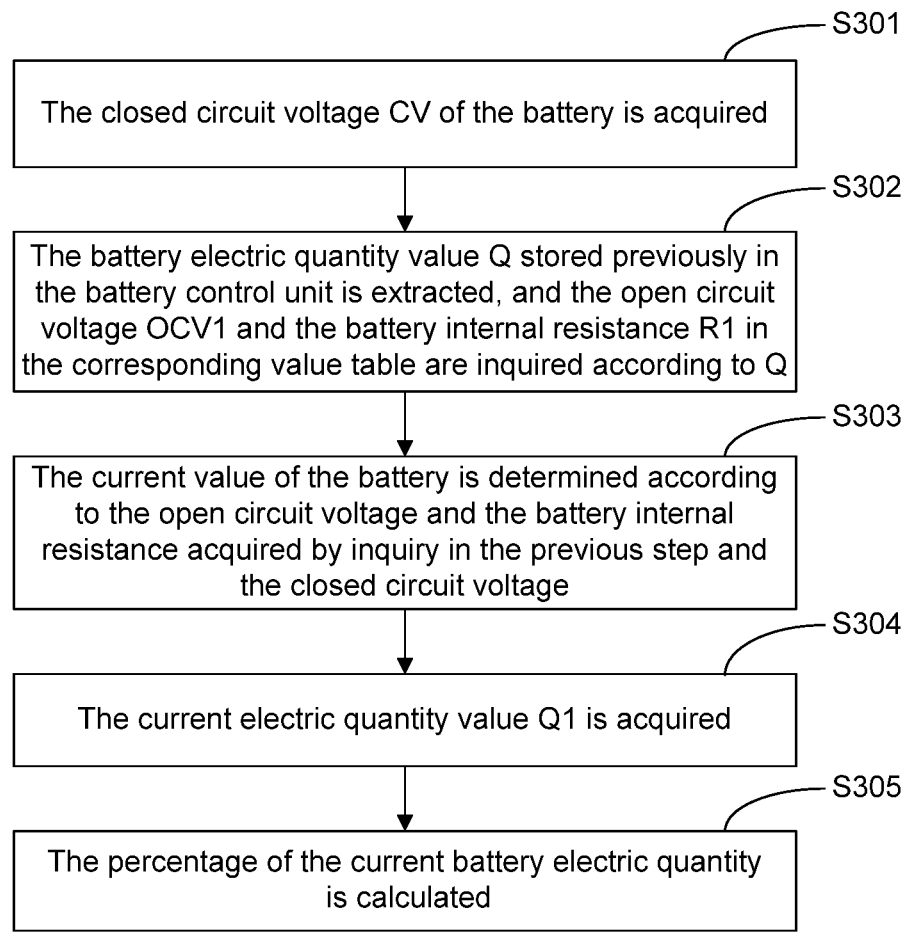
FIG. 4 is a flow chart for detecting the battery electric quantity in the second embodiment of the disclosure.
Figure 5:
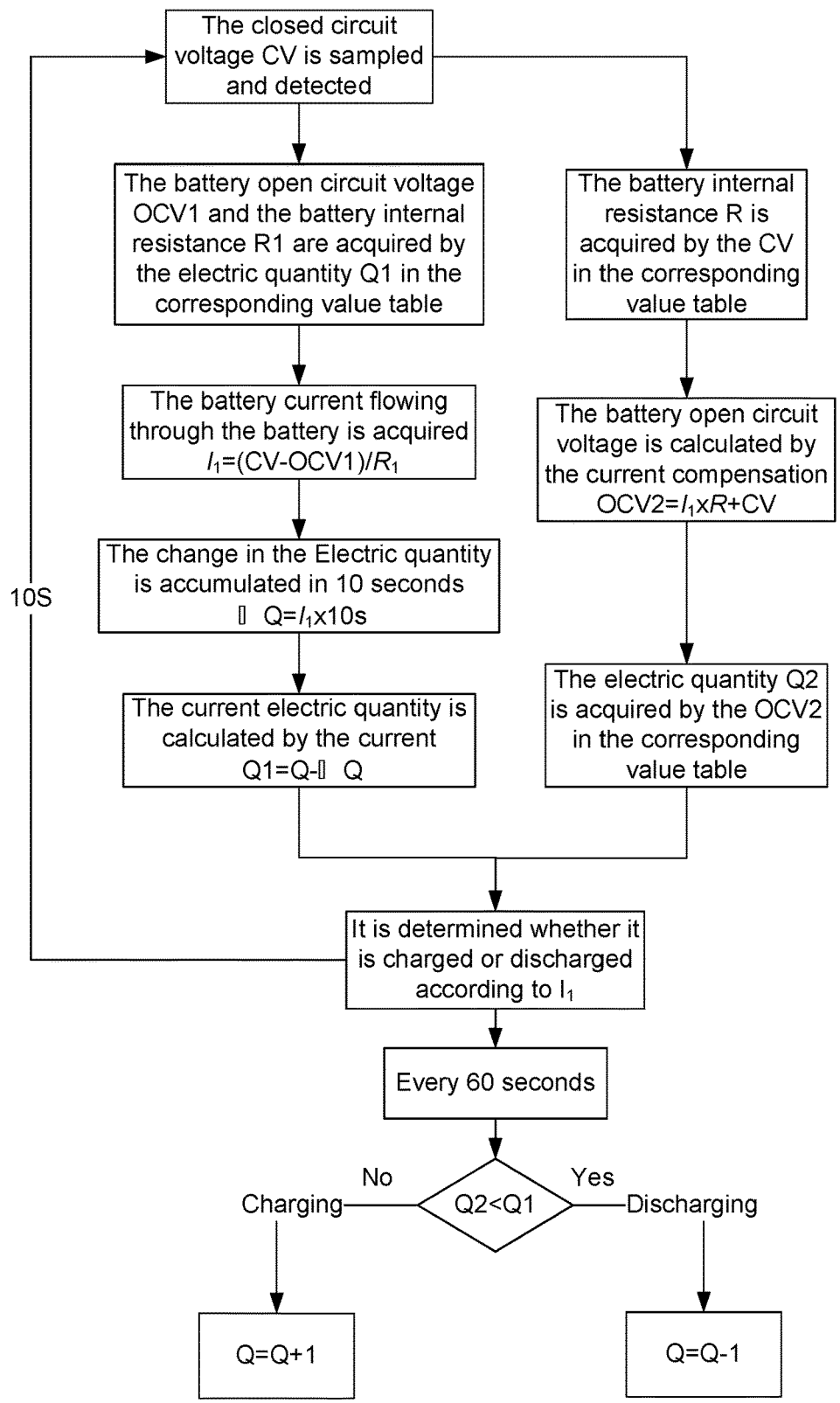
FIG. 5 is a flow chart for detecting the battery power in real time in the second embodiment of the disclosure.

Secondly, as shown in FIG. 4, the process of detecting the current electric quantity and the total capacity of the smart battery in the second embodiment of the disclosure may specifically include the following steps in connection with FIG. 5.

Step S301: The closed circuit voltage CV of the battery is acquired.

Specifically, the current closed circuit voltage CV is acquired by the voltage sampling unit in the smart battery.

Step S302: The battery electric quantity value Q stored previously in the battery control unit is extracted, and the open circuit voltage OCV1 and the battery internal resistance R1 in the corresponding value table are inquired according to the battery electric quantity value Q.

Specifically, when a user uses the smart battery for the first time, the battery control unit will automatically extract the battery electric quantity value Q stored when the smart battery leaves factory, and detect the current temperature information of the smart battery. The battery control unit will store the battery electric quantity value after each calculation, and the battery control unit will automatically extract the previously stored battery electric quantity when it needs to be called next time.

The open circuit voltage OCV1 and the battery internal resistance R1 are acquired by inquiring the corresponding value of the open circuit voltage, the battery electric quantity and the battery internal resistance at the current temperature in the corresponding value table according to the battery electric quantity value Q. It is to be noted that since in the embodiment of the disclosure, the battery electric quantity is detected in real time, and the change in the open circuit voltage and the battery internal resistance at the same temperature may be ignored when the adjacent two detections are performed. The battery open circuit voltage and the battery internal resistance acquired by the previous battery electric quantity value in the corresponding value table may be used for the calculation of the current electric quantity in this time of detection.

Step S303: The current value of the current battery is determined according to the open circuit voltage and the battery internal resistance acquired by inquiry in the previous step and the closed circuit voltage.

Specifically, the current value $I_1$ may be acquired by an interpolation conversion according to the open circuit voltage OCV1, the internal resistance $R_1$, and the closed circuit voltage CV.

The current value $I_1$ may also be acquired by the following equation (1):

$$I_1=(CV-OCV1)/R_1 \quad (1)$$

The current value $I_1$ may also be calculated by using other algorithms, and it is not limited thereto in the embodiment of the disclosure.

Step S304: The current battery electric quantity value Q1 is acquired.

Specifically, the battery internal resistance R at this time is inquired in the corresponding value table by taking the closed circuit voltage CV as the open circuit voltage, and the open circuit voltage OCV2 of the battery at this time is calculated by the formula (2) according to the current $I_1$ calculated in the previous step, the closed circuit voltage CV, and the battery internal resistance R.

$$OCV2=CV+I_1 \times R \quad (2)$$

Then the actual electric quantity value Q2 of the battery is acquired by inquiring the corresponding value table according to the calculated open circuit voltage.

It is possible to determine whether the battery is in a charged or discharged state according to the current $I_1$. In the embodiment, the electric quantity of the battery may be increased by one or decreased by one every one minute, that is, every 60 seconds. The electric quantity is increased by one when the battery is in the charged state, and is decreased by one when the battery is in the discharged state. Assuming that the electric quantity of the battery of the next 60 seconds is Q2, then $$Q_2=I_1 \times t \quad (3)$$

Since the change in the calculated current $I_1$ in 60 seconds may be ignored, $I_1$ may be regarded as a fixed value, and may also be calculated by calculating the average current value within 60 seconds. In another 60 seconds, the current value $I_1$ at that time is recalculated.

Step S305: The percentage of the current battery electric quantity is calculated.

Specifically, since the battery will gradually deteriorate and the capacity of the battery will be gradually attenuated with the use of the battery, if the battery capacity information provided at the time of leaving factory is always used, it is likely that the calculated percentage of the battery electric quantity is not accurately displayed when the capacity of the battery is attenuated. Therefore, the capacity of the battery needs to be detected regularly.

The detection and calibration of the capacity of the battery may be acquired by detecting one entire charging process. Specifically, the battery capacity information is acquired at the completion of charging for the battery in which the electric energy stored at the start of charging is below a preset threshold.

In one embodiment, the battery capacity calibration is started when the battery electric quantity is less than or equal to 10% and charging is started. For example, when the battery electric quantity is 10% at this moment, the battery capacity detection calibration is started. When the battery is fully charged, namely, when the remaining 90% of battery electric quantity is fully charged, the charged 90% of the electric quantity is divided by 90% to acquire the battery capacity Qr at this moment, and the battery capacity information at this moment is updated. If the battery starts to be charged when the electric quantity is 5%, the battery capacity detection and calibration is started at this moment. When the battery is fully charged, namely, when the remaining 95% of battery electric quantity is fully charged, the charged 95% of the electric quantity is divided by 95% to acquire the battery capacity Qr at this moment, and the battery capacity information at this moment is stored and updated.

When measuring the percentage of the electric quantity of the battery, the capacitance electric quantity Q at this moment is divided by the battery capacity Qr acquired by a recent measurement, that is, the percentage of the battery electric quantity acquired is obtained consequently. The battery control unit may send the detected information to the terminal through the interface unit.

In addition, in the process of refreshing the detection of the battery electric quantity in real time, for example, while charging the battery, if the battery electric quantity does not reach 100% at this moment, the battery electric quantity is sent to the terminal by increasing the battery electric quantity by one every 10 seconds until 100, that is, the full state of the battery.

Figure 6:
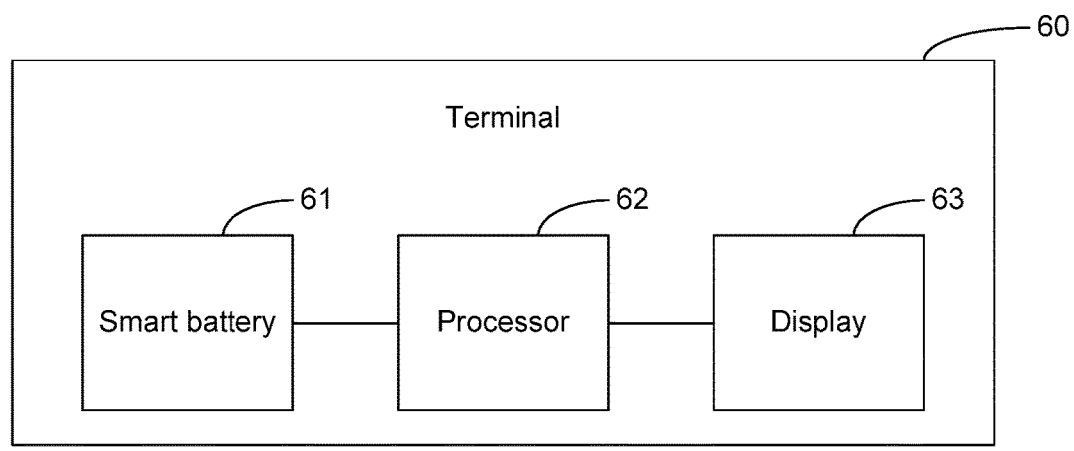
FIG. 6 is a structure schematic view of a terminal in a third embodiment of the disclosure.

The third embodiment of the disclosure provides a terminal, as shown in FIG. 6.

The terminal 60 provided by the embodiment of the disclosure includes: a smart battery 61, a processor 62 and a display 63.

Herein, the smart battery 61 may use the smart battery in the first embodiment of the disclosure, and will not be described again here. In addition, the processor 62 is configured to receive the battery electric quantity information and the battery capacity information sent by the smart battery 61, and process the battery electric quantity information and the battery capacity information as displayable information; and the display 63 is configured to display the displayable information after being processed by the processor 62.

The battery information detection and control method, the smart battery and the terminal described in the embodiments of the disclosure solve the problems that the battery electric quantity cannot be detected in real time and the battery capacity cannot be updated in time in the conventional art, thereby overcoming individual differences among different batteries. The electric quantity detection and the battery protection are provided to the battery to control by itself. The battery capacity can be calibrated in real time and the battery electric quantity can be updated in time through its own integrated control for the battery, and the detection result can be sent to the terminal. After an abnormal situation occurs in the battery, if the terminal does not stop charging in time, the battery charging can be cut off in time.

Those skilled in the art should understand that the embodiments of the disclosure can provide a method, a system or a computer program product. Thus, forms of hardware embodiments, software embodiments or embodiments integrating software and hardware can be adopted in the disclosure. Moreover, a form of the computer program product implemented on one or more computer available storage media (including, but not limited to, a disk memory, an optical memory and the like) containing computer available program codes can be adopted in the disclosure.

The disclosure is described with reference to flowcharts and/or block diagrams of the method, the equipment (system) and the computer program product according to the embodiments of the disclosure. It should be understood that each flow and/or block in the flowcharts and/or the block diagrams and a combination of the flows and/or the blocks in the flowcharts and/or the block diagrams can be realized by computer program instructions. These computer program instructions can be provided for a general computer, a dedicated computer, an embedded processor or processors of other programmable data processing devices to generate a machine, so that an apparatus for realizing functions assigned in one or more flows of the flowcharts and/or one or more blocks of the block diagrams is generated via instructions executed by the computers or the processors of the other programmable data processing devices.

These computer program instructions can also be stored in a computer readable memory capable of guiding the computers or the other programmable data processing devices to work in a specific mode, so that a manufactured product including an instruction apparatus is generated via the instructions stored in the computer readable memory, and the instruction apparatus realizes the functions assigned in one or more flows of the flowcharts and/or one or more blocks of the block diagrams.

These computer program instructions can also be loaded to the computers or the other programmable data processing devices, so that processing realized by the computers is generated by executing a series of operation steps on the computers or the other programmable devices, and therefore the instructions executed on the computers or the other programmable devices provide a step of realizing the functions assigned in one or more flows of the flowcharts and/or one or more blocks of the block diagrams.

The technical means and effect of the disclosure for achieving the intended purpose should be more in-depth and specific from the description of the detailed description, but the accompanying drawings are provided for the purpose of reference and description only, rather than limiting the disclosure.

What is claimed is:

1. An information processing method, applied to a smart battery comprising an energy storage unit, a battery charging protection unit and a battery control unit, comprising:
    detecting, by the battery control unit, battery capacity information, battery level information and temperature information of the smart battery in real time in a process of charging the smart battery;
    sending, by the battery control unit, the battery capacity information, the battery level information and the temperature information to a terminal; and
    determining, by the battery control unit, whether to charge the energy storage unit of the smart battery according to the battery capacity information, the battery level information and the temperature information, wherein:
        the battery charging protection unit comprises: a P-channel Metal Oxide Semiconductor (PMOS) transistor, a transistor, a first resistor, a second resistor, and a third resistor,
        a drain of the PMOS transistor is electrically connected with the terminal after being electrically connected with an input of the first resistor, a source of the PMOS transistor is electrically connected with the energy storage unit, an output of the first resistor is electrically connected with a collector of the transistor after being electrically connected with a gate of the PMOS transistor, an input of the second resistor is electrically connected with the battery control unit, an output of the second resistor is electrically connected with an input of the third resistor and a base of the transistor, and an output of the third resistor is grounded after being electrically connected with an emitter of the transistor,
        the transistor and the PMOS transistor are conductive and charge the energy storage unit when the input of the second resistor receives a high level outputted by the battery control unit; and the transistor and the PMOS transistor are non-conductive and stop charging the energy storage unit when the input of the second resistor receives a low level outputted by the battery control unit,
        the energy storage unit comprises a processor for implementing functions corresponding to the energy storage unit,
        the battery charging protection unit comprises a processor for implementing functions corresponding to the battery charging protection unit, and
        the battery control unit comprises a processor for implementing functions corresponding to the battery control unit.

2. The method according to claim 1, wherein detecting the battery capacity information comprises:
    acquiring the battery capacity information at a completion of charging for the smart battery in which electric energy stored at a start of charging is below a preset threshold.

3. The method according to claim 1, wherein determining, by the battery control unit, whether to charge the energy storage unit of the smart battery according to the battery capacity information, the battery level information and the temperature information comprises:
    controlling the battery charging protection unit to stop charging the energy storage unit when the battery level information, the battery capacity information and the temperature information are detected to reach a preset condition; and
    controlling the battery charging protection unit to charge the energy storage unit when the battery level information, the battery capacity information and the temperature information are detected to not reach the preset condition,
    wherein the preset condition comprises: temperature of the smart battery exceeds a preset value; or a battery level reaches 100%.

4. The method according to claim 1, wherein the method further comprises: sampling a voltage corresponding to electric energy in the smart battery to generate a sampled voltage that is configured to provide a basis for detecting the battery level information.

5. A non-transitory computer storage medium comprising a set of instructions which, when executed, cause at least one processor to execute the information processing method according to claim 1.

6. A smart battery, comprising: an energy storage unit, a battery charging protection unit and a battery control unit; wherein:
    the energy storage unit is configured to store electric energy and provide electric energy to a terminal and the battery control unit; and
    the battery control unit is configured to detect battery capacity information, battery level information and temperature information of the smart battery in real time in a process of charging the smart battery, send the battery level information, the battery capacity information and the temperature information to the terminal, and determine whether to charge the energy storage unit of the smart battery according to the battery level information, the battery capacity information, and the temperature information, the battery charging protection unit comprises: a P-channel Metal Oxide Semiconductor (PMOS) transistor, a transistor, a first resistor, a second resistor, and a third resistor, a drain of the PMOS transistor is electrically connected with the terminal after being electrically connected with an input of the first resistor, a source of the PMOS transistor is electrically connected with the energy storage unit, an output of the first resistor is electrically connected with a collector of the transistor after being electrically connected with a gate of the PMOS transistor, an input of the second resistor is electrically connected with the battery control unit, an output of the second resistor is electrically connected with an input of the third resistor and a base of the transistor, and an output of the third resistor is grounded after being electrically connected with an emitter of the transistor, the transistor and the PMOS transistor are conductive and charge the energy storage unit when the input of the second resistor receives a high level outputted by the battery control unit; and the transistor and the PMOS transistor are non-conductive and stop charging the energy storage unit when the input of the second resistor receives a low level outputted by the battery control unit, the energy storage unit comprises a processor for implementing functions corresponding to the energy storage unit, the battery charging protection unit comprises a processor for implementing functions corresponding to the battery charging protection unit, and the battery control unit comprises a processor for implementing functions corresponding to the battery control unit.

7. The smart battery according to claim 6, wherein the battery control unit is further configured to acquire the battery capacity information at a completion of charging for the smart battery in which the electric energy stored at a start of charging is below a preset threshold.

8. The smart battery according to claim 6, wherein the battery control unit is further configured to control the battery charging protection unit to stop charging the energy storage unit when the battery level information, the battery capacity information and the temperature information are detected to reach a preset condition; and control the battery charging protection unit to charge the energy storage unit when the battery level information, the battery capacity information and the temperature information are detected to not reach the preset condition, wherein the preset condition comprises: temperature of the smart battery exceeds a preset value; or a battery level reaches 100%.

9. The smart battery according to claim 6, wherein the smart battery further comprises:

a voltage sampling unit, including a processor, configured to sample a voltage of the electric energy to generate a sampled voltage and send the sampled voltage to the battery control unit wherein the sampled voltage is configured to provide a basis for detecting the battery level information.

10. A terminal comprising the smart battery according to claim 6, the terminal further comprising:

a processor configured to receive the battery level information and the battery capacity information sent by the smart battery, and process the battery level information and the battery capacity information as displayable information; and a display configured to display the displayable information.

* * * * *